United States Patent [19]
Lane et al.

[11] Patent Number: 5,521,940
[45] Date of Patent: May 28, 1996

[54] METHOD AND DEVICE FOR THE COMPRESSION AND DECOMPRESSION OF DATA IN A TRANSMISSION SYSTEM

[75] Inventors: Thao Lane; Jean-Marc Ernault, both of Rennes; Bernard Thepault, Cesson Sevigne, all of France

[73] Assignee: Ouest Standard Telematique SA, Cesson Sevigne, France

[21] Appl. No.: 284,480

[22] PCT Filed: Feb. 11, 1993

[86] PCT No.: PCT/FR93/00142

§ 371 Date: Aug. 2, 1994

§ 102(e) Date: Aug. 2, 1994

[87] PCT Pub. No.: WO93/16541

PCT Pub. Date: Aug. 19, 1993

[30] Foreign Application Priority Data

Feb. 11, 1992 [FR] France ................................ 92 01657

[51] Int. Cl.⁶ ........................................................ H04B 1/66
[52] U.S. Cl. .............................. 375/240; 370/99; 370/118
[58] Field of Search ................................ 375/240, 241; 370/99, 118; 341/51, 95; 455/72; 348/384; 358/133

[56] References Cited

U.S. PATENT DOCUMENTS

| | | | |
|---|---|---|---|
| 4,058,672 | 11/1977 | Crager et al. | 370/109 |
| 4,464,650 | 8/1984 | Eastman et al. | 340/347 |
| 4,814,746 | 3/1989 | Miller et al. | 341/95 |
| 4,872,009 | 10/1989 | Tsukiyama et al. | 341/95 |
| 5,258,983 | 11/1993 | Lane et al. | 375/240 |
| 5,293,379 | 3/1994 | Carr | 370/118 |
| 5,307,413 | 4/1994 | Denzer | 375/240 |

FOREIGN PATENT DOCUMENTS

| | | |
|---|---|---|
| 0349464 | 1/1990 | European Pat. Off. . |
| 0429054 | 5/1991 | European Pat. Off. . |
| 0464564 | 1/1992 | European Pat. Off. . |

Primary Examiner—Stephen Chin
Assistant Examiner—T. Ghebretinsae
Attorney, Agent, or Firm—Kinney & Lange

[57] ABSTRACT

A method for the compression of data applied to a system for the transmission of data in protocol data units between at least one emitter terminal and at least one receiver terminal. Each protocol data unit comprises a header field and a data field. A first sequence of N source protocol data units is associated with a second sequence of M protocol data units to be transmitted, M being smaller or equal to N. The data fields of the protocol data units transmitted comprise data that has been compressed (according to at least one compression algorithm). The data fields are then made up of data contained in the data fields that has been compressed, and also data allowing reconstruction of N source protocol data units.

21 Claims, 4 Drawing Sheets

METHOD AND DEVICE FOR THE COMPRESSION AND DECOMPRESSION OF DATA IN A TRANSMISSION SYSTEM

BACKGROUND OF THE INVENTION

The field of the invention is that of data compression systems and, more specifically, that of structured transmission systems wherein the communications between two terminals are achieved by exchanges between protocol data units or PDUs.

The invention can be applied notably to packet transmission systems (systems implementing a layer 3 procedure according to the seven-layer OSI standardization model), but also to frame transmission systems (layer 2) or systems using transport protocol data units (layer 4). More generally, the invention can be applied to any type of transmission system, whatever the layer (according to the terminology of the OSI standards) of the communications protocol associated with the system considered.

One particular field of application of the invention is that of data exchange systems working according to the X25 protocol standardized by the CCITT. On French territory, the invention can be applied therefore to communications made through the public TRANSPAC (registered mark) network.

The invention relates more particularly to the optimization of communications, i.e. notably the reduction of costs through the reduction of volumes of data transmitted and/or of communication times.

It is indeed known that, especially when a public communications network needs to be used, the costs generally depend inter alia on the number of protocol data units (or subsets of these units) transmitted and on the communication times.

A known way of reducing the volume of the data transmitted is to compress the data to be transmitted.

Many data compression techniques are indeed known, notably for point-to-point links. Thus for example an adaptive compression algorithm called the Ziv-Lempel algorithm has been chosen in the CCITT recommendation V42a for asynchronous modems.

However, in the case of systems working by exchanges of protocol data units, for example according to the x25 standard, several difficulties are generally encountered.

Thus, there is a known system, called DATAMISER (registered mark), that methodically carries out the byte-by-byte compression of the entire flow of data delivered by a terminal. When this flow of data is organized in protocol data units, each comprising zones descriptive of the exchange (header fields) and data zones (data fields), a compression system such as this does not comply with this form of structuring. In other words, it neither recognizes nor keeps the headers. It therefore cannot be used for an exchange going through a packet-switched network.

In order to overcome this drawback, the selective compression of the data zones might be considered. In this case, the headers are preserved integrally, and the quantity of information elements to be transmitted is substantially reduced. In other words, with a source protocol data unit, there is associated a compressed protocol data unit whose header is identical to that of the source protocol data unit.

In practice, it turns out that the efficiency of this technique is not optimal. Indeed, the number of packets (or PDUs) transmitted remains by definition the same. The gain is therefore minimal since partially empty packets are transmitted.

The invention is notably aimed at overcoming these various drawbacks of the prior art.

More specifically, an aim of the invention is to provide a method to optimize the efficiency of communications made on a data exchange network, reducing the number of protocol data units or subsets of units transmitted.

Another aim of the invention is to provide a method such as this that relates to the structure of the protocol data units transmitted. In other words, an aim of the invention is to provide a method such as this that is transparent from the viewpoint of the terminals as well as from that of the transmission network.

More generally, the invention is aimed at providing a method such as this that enables the reduction of at least one of the following parameters:

cost of the call;

duration of the call;

volume of traffic generated by the network (in terms of number of PDUs and/or bytes) without losing any element of the information transmitted.

Another aim of the invention is to provide a method such as this that can be implemented on any structured system of data transmission.

The invention is also aimed at providing a device, implementing a method such as this, that can be inserted between a terminal and a communications network transparently, i.e. without requiring any adaptation either of the terminal or of the network.

These aims as well as others that shall appear hereinafter are achieved, according to the invention, by means of a data compression method of the type applied to a system of data transmission by the exchange of protocol data units between at least one transmitter terminal and at least one receiver terminal, each of said protocol data units comprising a header field and a data field, said method associating, with a first sequence of N source protocol data units, a second sequence of M protocol data units to be transmitted, M being smaller than or equal to N, at least certain of the data fields of said protocol data units to be transmitted comprising data corresponding to the compression, according to at least one compression algorithm, of data contained in the data fields of at least two of said source protocol data units, and at least certain of said protocol units to be transmitted comprising reconstruction data enabling the reconstruction of said first sequence of source protocol data units from said second sequence of protocol data units to be transmitted.

In this way, the efficiency of the call may be greatly increased but the initial structure of the data is preserved. It is indeed possible, at reception, to reconstitute the source sequence by means of the reconstruction data added to the transmitted data.

SUMMARY OF THE INVENTION

According to the invention, the structure of the data is modified briefly during the transmission. This enables a reduction in the number of protocol data units to be transmitted but there is provision for a new step, additional to that of the known techniques, namely the insertion, among the pieces of compressed data to be transmitted; of reconstruction data.

A method of this kind advantageously comprises the steps of:

the reception of said first sequence of source protocol data units, data compression associating, with each of said protocol data units, a compressed data sub-field comprising data corresponding to the compression of the data of the data field of said source protocol data unit, the generation of data for the reconstruction of said source protocol units, the concatenation of said reconstruction data and said compressed data sub-fields in a sequence of concatenated data, the slicing of said sequence of concatenated data into data blocks having a predetermined length chosen from a sub-set of at least one possible length, the creation of said second sequence of protocol data units to be transmitted, the data field of each of said protocol data units to be transmitted comprising at least one of said data blocks.

According to this method therefore, a sub-protocol of the network is therefore added, so to speak, transparently (for this network). It must be noted that the steps of concatenation, slicing and creation of the second sequence, which have been highlighted here solely in order to make it easier to understand the invention, may actually be done simultaneously (the creation of a packet is begun as soon as the pieces of data to be concatenated are received).

In practice, the steps of concatenation and slicing are generally carried out simultaneously: full packets are formed by concatenation and the packet is sent out as soon as it is full. If a data sub-field has been sliced (to fill up the data field of a packet to be transmitted), the remaining part of this sub-field forms the start of the data field of the next packet to be transmitted.

Advantageously, said step for the generation of reconstruction data comprises a step of association (26), with each of said compressed data sub-fields (30), of a sub-header (29) comprising at least one information element (27) representing the length of said compressed data sub-field (30).

According to other advantageous embodiments of the invention, said step for the generation of reconstruction data may comprise:

a step for the association (26), with each of said compressed data sub-fields (30), of a sub-header (29) comprising at least one designator designating the position of the end of said sub-field in the data field of the corresponding protocol unit to be transmitted (51$_i$);

a step to generate a marker having a predetermined content, known to said receiver terminal;

a step for the association, with each protocol data unit to be transmitted (51$_i$), of a descriptor of the content of the data field of said protocol data unit.

Preferably, said data enabling the reconstruction of said first sequence of source protocol data units include at least one of the information elements present in the header field of each of said source protocol data units.

Indeed, apart from the length of the compressed data, it may be necessary, in order to reconstitute the source sequence, to keep information elements that qualify the source protocol data units.

In a particular embodiment of the invention, said sub-header comprises at least one first byte bearing at least one of the information elements present in the header field of the source protocol data unit corresponding to said sub-header, and at least one second byte bearing the length of the associated compressed data sub-field.

Advantageously, said compression algorithm is an adaptive compression algorithm managing dictionaries of series of data at transmission and at reception, said dictionaries being updated identically at each transmission of one of said protocol data units.

Indeed, this adaptive algorithm proves to be especially promising in terms of compression efficiency.

Preferably, the method includes a data compression step comprising the steps of:

implementing a compression algorithm that associates a compressed data field with a source data field;

comparing the length of said source data field and compressed data field and selecting the shortest data field as the compressed data sub-field.

It is clear that if the compression is not efficient, it will be preferable to transmit the data in a non-compressed form.

In this case, said sub-header has an information element representing said selection of the source data field or of the compressed data field.

The protocol data units considered may be of any type, for example the type comprising data packets, data frames or layer 4 (transport) protocol data units.

In a standard way, these protocol data units may have a protocol data unit length chosen from a set comprising at least one possible length.

Advantageously, the method also includes a step for the initializing of a transmission, consisting notably in ascertaining that the receiver has means available to implement a decompression method corresponding to said compression method.

The term "receiver" is understood to mean terminals equipped internally with compression/decompression means or specific compression/decompression devices associated with terminals.

The invention can therefore be used to transmit only full data units since their data fields include concatenated data belonging to several source units. However, the filling of a unit should not be an obligatory condition, otherwise there is a risk that the method may be inhibited. Indeed, especially when an end of a sequence is concerned, it should be possible to send out an incomplete data unit. To this end, two time delays may be envisaged.

Thus, the method advantageously comprises a first time-delay step fixing a maximum waiting period D1 before the creation of a non-full protocol data unit to be transmitted.

Furthermore, it may also include a second time-delay step, fixing a maximum waiting period D2, D2 being smaller than D1, before the creation of a protocol data unit to be transmitted comprising at least one full data block of a predetermined length and no data block that is not full.

The invention relates naturally to a decompression method that is symmetrical with a compression method described here above, comprising the steps of:

searching for and analyzing said data enabling the reconstruction of said first sequence of protocol data units, the decompression of said data corresponding, in compressed form, to the data contained in the data fields of the source protocol data units;

the restitution of said first sequence of source protocol data units.

It also relates to any device implementing this method of compression and/or this method of decompression and notably a device comprising, firstly, means of connection to at least one transmitter/receiver terminal, behaving similarly to the data transmission system and, secondly, means of connection to said data transmission system behaving similarly to a transmitter/receiver terminal.

In this way, the device is quite transparent.

Other features and advantages of the invention shall appear from the following description of a preferred embodiment of the invention, given by way of a non-restrictive illustration, and from the appended drawings of which:

DETAILED DESCRIPTION OF THE PREFERRED EMBODIMENTS

The embodiment described here below can be applied notably to communications networks providing an interface according to the standard x25, and especially to networks using a segment-based pricing system such as the French public network TRANSPAC (registered mark). It is clear however that the invention is not restricted to networks of this type but may be applied, on the contrary, in every case where the exchange of data is clone by protocol data units.

Thus, although hereinafter it is more specifically the case of data packets that will be considered, the invention can be implemented at every layer of the standardization protocol OSI, notably at the layer 2 and/or at the layer 4.

As stated further above, an aim of the invention therefore is to improve the efficiency of the communications on a given network while at the same time preserving the structure of the data train transmitted.

Figure 1:
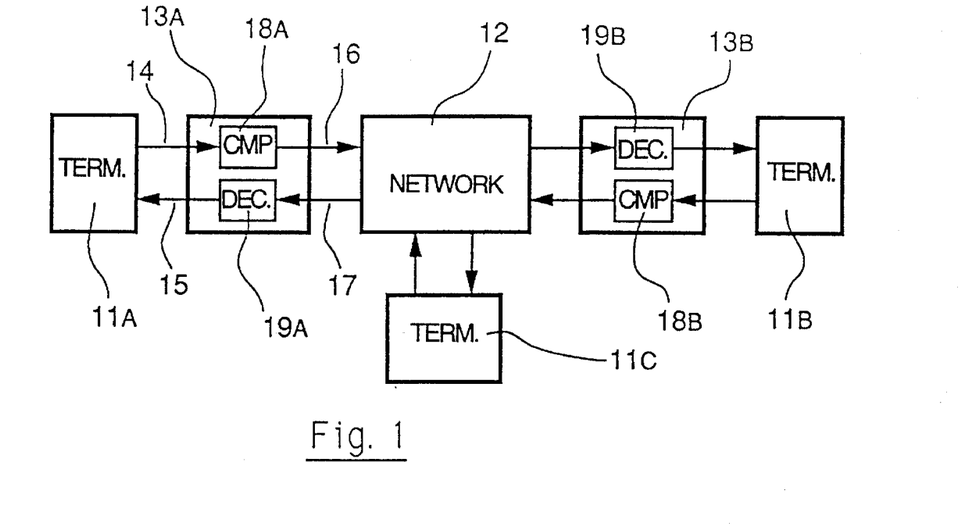
FIG. 1 shows a schematic view of a data transmission system comprising two devices according to the invention.

FIG. 1 exemplifies an implementation of the invention. Three transmitter/receiver terminals $11_A$, $11_B$ and $11_C$ are connected to a packet communications network 12.

These terminals $11_A$ and $11_C$ represent any end system that can get connected to a network such as for example a computer, a data base center, a data acquisition terminal, etc.

Two terminals $11_A$ and $11_C$ can be associated for a particular call. These two terminals can, if necessary, manage several calls simultaneously. For example, the terminal $11_A$ can handle a first call with the terminal $11_B$ at the same time as a second call with the terminal $11_C$.

In the preferred embodiment of the invention described in relation with FIG. 1, the compression/decompression means are installed in devices $13_A$ and $13_B$ that are independent of the terminals $11_A$ and $11_B$. These compression/decompression devices are therefore spliced into the connection cable to the network and are transparent both for the terminal $11_A$ and for the network 12. In other words, seen from the terminal $11_A$, the device $13_A$ behaves (14, 15) like the network and, seen from the network 12, it behaves like a terminal (16, 17).

Each device $13_A$, $13_B$ includes data compression means $18_A$, $18_B$ implementing the method that shall be described hereinafter and symmetrical decompression means $19_A$, $19_B$.

Hereinafter, it is essentially the compression method that shall be described. The decompression method can easily be deduced therefrom by symmetry.

It must be noted that the compression of the data of a call is not done systematically. First of all, the receiver terminal must be associated with (or must include) a decompression device. Thus, any call implicating the terminal $11_C$ will be made without compression. Furthermore, the two compression/decompression devices $13_A$ and $13_B$ must have necessary means (processing and/or memory means). It is possible, for example, to provide for devices that are capable of managing several calls, only a limited number of them being calls with compression/decompression.

Furthermore, it is quite possible to envisage a case where the compression is implemented only in one of the two directions of the call, depending on the means available and/or on the usefulness of the compression, in terms of efficiency, in each direction of communication.

Finally, although the devices $13_A$ and $13_B$ are represented herein in the form of independent units, this independence having the major advantage of enabling their use with all types of existing terminals (it is enough to interconnect the device $13_A$ between the terminal $11_A$ and the network 12), it is clear that the same compression/decompression means may be integrated with a terminal.

Figure 2:
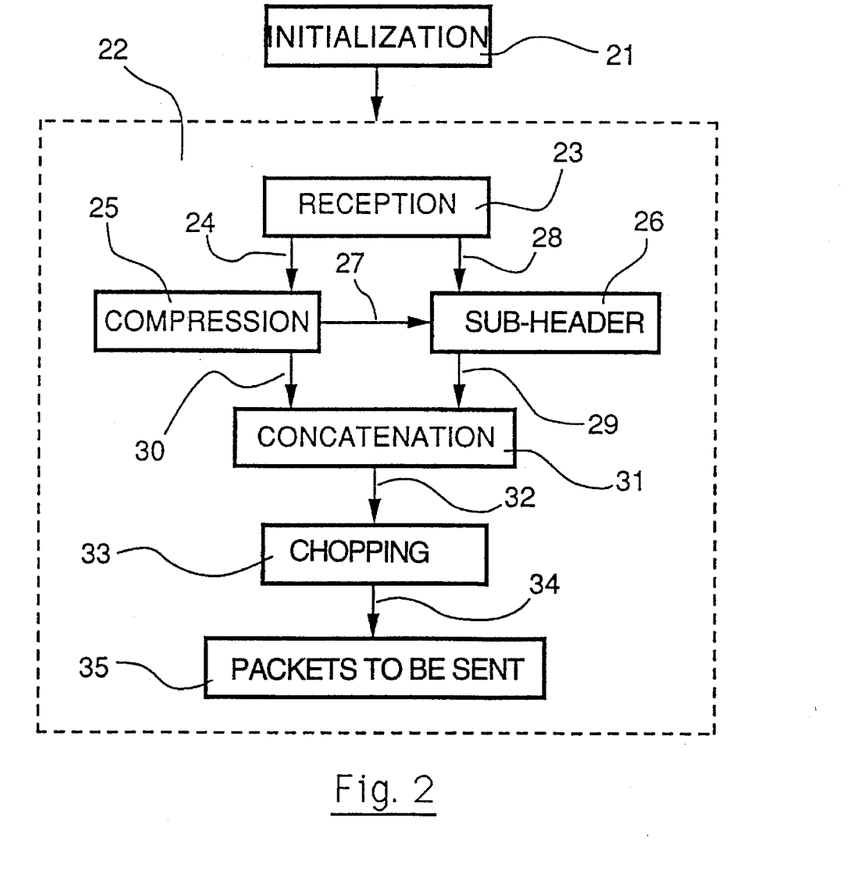
FIG. 2 is a block diagram illustrating the compression method of the invention.

FIG. 2 is a simplified block diagram of the compression method of the invention.

At the beginning of each call, it is possible, first of all (if this is necessary), to carry out an initialization phase 21 consisting notably in ascertaining that the receiver device has corresponding compression/decompression means available.

This phase 21 comprises first of all a check on whether the target terminal has a compression/decompression device available. This can be done either passively, with each compression device managing a list of terminals capable of carrying out the decompression, or actively by means of an interactive interrogation procedure. In a second stage, it must be ascertained that the receiver device has decompression means available.

First of all (if the compression is possible), a compression phase proper 22 is undertaken. This phase 22 includes a step 23 for the reception of the source packets to be compacted. It must be noted that the method of the invention makes no assumption on the sequence of packets received nor on the constitution of these packets. These packets may or may not be full and may have a fixed or variable size, originate from a variety of sources etc. The method of the invention is completely transparent with respect to the original structure.

By contrast, as shall be seen hereinafter, it ensure that this original structure will be preserved.

It has already been explained in the preamble that it is not possible to compress the data fields and the headers without distinction. According to the invention, only the data field 24 undergoes a compression 25. A particular advantageous method of compression is the one used in a compression algorithm of the so-called "Ziv-Lempel" type. The basic principles of encoding/decoding and updating the dictionaries are similar to those described in the recommendation V42a. Of course, any other compression algorithm may be used. If necessary, several algorithms may be implemented simultaneously, the most efficient result being the only one preserved.

Furthermore, a sub-header or information zone is created (26), this sub-header or information zone comprising notably an information element 27 representing the length of the compressed data field delivered by the compression step 25. This header furthermore has the data 28 needed to reconstruct the original sequence of packets, i.e. especially the information elements indicating, in the header of each original packet (non-compressed), the type of packet (qualifying information), the structuring in complete messages according to the protocol x25, etc. A particular example of a sub-header is described further below with reference to FIG. 4.

The sub-header 29 and the compressed data field 30 corresponding to each source packet are then concatenated (31) in a continuous sequence 32 of data. This sequence 32 is then sliced (33) arbitrarily, i.e. without regard to the original packets, to a length corresponding to a data field length permitted by the network or to a length that is a sub-multiple of this permitted length.

Each block 34 thus sliced off is used for the creation (35) of a new packet of which it becomes the data field (or a portion of this field). This new packet on the contrary has a new header that is proper to it.

Figure 3:
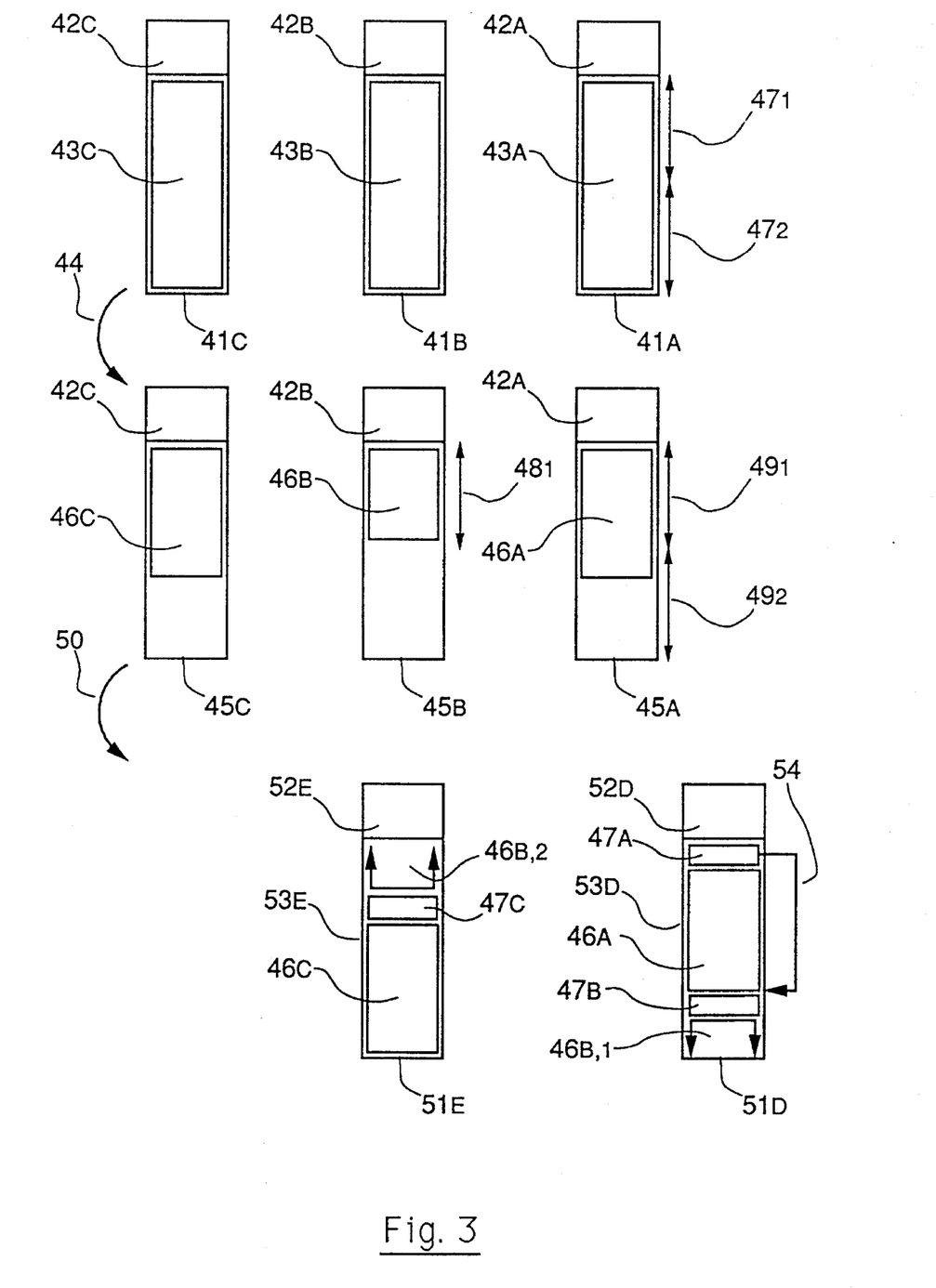
FIG. 3 illustrates the processing undergone by a source packet sequence according to the method of FIG. 2.

The efficiency of this method will be perceived more clearly in the exemplary compression shown in FIG. 3.

A source sequence of three consecutive packets $41_A$, $41_B$ and $41_C$ is considered. Each packet is constituted in a standard way by a header $42_A$, $42_B$ and $42_C$ (in the example considered, according to the standard x25) and a data field $43_A$, $43_B$ and $43_C$.

The example considered here is that of full packets (however this is in no way an obligatory condition) having a format in accordance with the one permitted by the communications network.

Each packet $41_i$ is therefore then compressed (44). Thus, a sequence of compressed packets $45_A$, $45_B$, $45_C$ is obtained. Naturally, the number of packets is preserved and the headers $42_A$ to $42_C$ of each of them remains unchanged. By contrast, the length of the data fields $46_A$, $46_B$ and $46_C$ is substantially reduced.

This compression proves to be valuable, especially when the network uses a segment-based pricing system.

This is notably the case of the TRANSPAC network which uses 64-byte segments for its pricing. This slicing into segments, which is different from the packet structure, is basically aimed at encouraging users to send out full data packets. Indeed, each segment begun (namely each segment containing at least one byte) is accounted for, and therefore has a cost price identical to that of a full segment (64 bytes).

Thus, the packet $41_A$, if sent, will be entered in the accounts for two segments $47_1$ and $47_2$. On the contrary, the packet $45_B$ has only one segment $48_1$ entered in the accounts. In this example, the compression enables a 50% reduction of the cost of the transmission of the packet.

However, a compression of this kind gives, at best, a compression rate of two (a 50% reduction of the volume of transmitted data), while the compression techniques often make it possible to obtain compression rates equal to 3, 4 or even more. Indeed, whatever the quality of the compression achieved, there will always be at least one segment invoiced per packet.

The invention proposes a novel and highly efficient approach to this problem. Indeed, after the compression 44, a complementary compaction processing step 50 is carried out.

According to the invention, a new sequence of packets $51_D$, $51_E$ is created. These packets are quite independent of the packets of the sequence $41_A$ to $41_C$. In particular, their headers $52_D$, $52_E$ correspond to none of the headers $42_A$ to $42_C$.

By contrast, the set of useful data needed for the reconstruction of the source packet train is available in the data fields $53_D$ and $53_E$ of the new packets $51_D$ and $51_E$.

More specifically, and this is the major characteristic of the invention, a data field $53_D$ does not contain solely the concatenated data of the data fields $46_A$ and $46_B$ but also, in the form of a sub-header $47_A$, data for the reconstruction of the original sequence.

This header $47_A$ is transparent from the viewpoint of the network. By contrast, at decompression, firstly it enables the extraction, from the data field $53_D$, of the sequence of data $46_A$ corresponding to the packet $45_A$, by the information on length 54. Secondly, it contain the information elements needed for reconstruction, at least partially, of the header $42_A$.

The data fields $53_D$ and $53_E$ are considered continuously. Thus, the compression data $46_B$ may be distributed without difficulty into two sub-sets $46_{B,1}$ and $46_{B,2}$ in two distinct packets. The sub-header $47_B$ indicates the end of the sub-set $46_{B,2}$. A sub-header may also be distributed over two packets.

Figure 4:
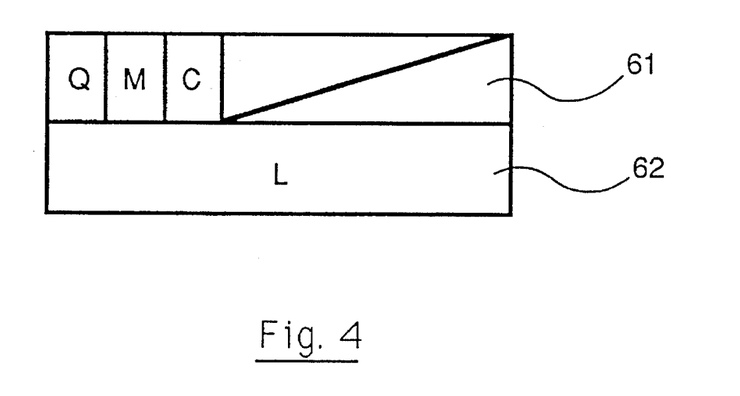
FIG. 4 exemplifies a sub-header that can be used in the compressed packets of FIG. 3.

FIG. 4 exemplifies a sub-header that can advantageously be used within the framework of the protocol x25.

This sub-header is constituted by two bytes 61 and 62. The first byte contains, firstly, two bits Q and M which are the direct reproduction of the bits Q (Q-bit) and M (M-bit) existing in the header of a packet according to the protocol x25. These bits are necessary, respectively, in order to qualify the packets and indicate the start or the end of a message.

Furthermore, it includes a bit C which indicates whether the compression has been implemented for the packet considered.

Five bits (63) are available for future developments. For example, they may carry an information element indicating the chosen mode of compression if several modes can be used.

The second byte comprises the length L of the sequence of compressed data on 8 bits (54, FIG. 3). This length, if necessary, may be encoded on two bytes or more.

Figure 5:
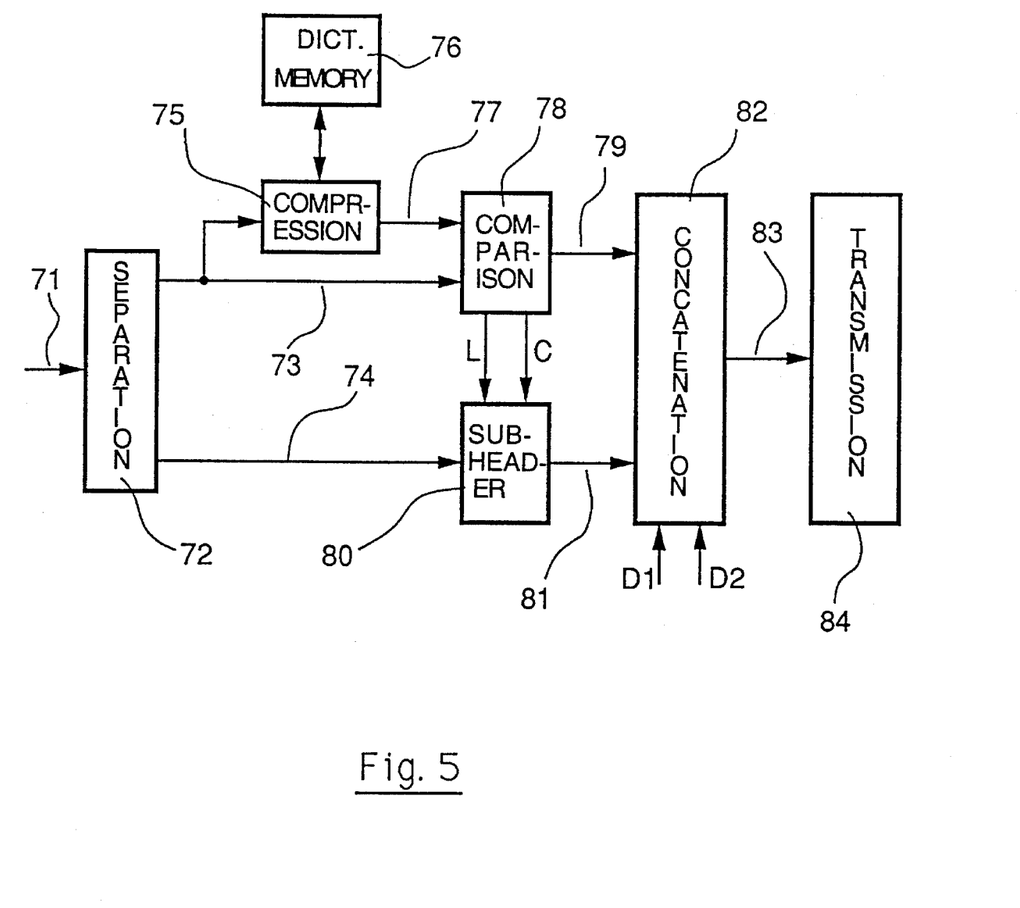
FIG. 5 is a simplified drawing of a device implementing the method of FIG. 2.

FIG. 5 shows a block diagram of a device according to the invention, as shown ($13_A$, $13_B$) in FIG. 1, implementing the method described here above.

The source packets 71 are received in a reception and separation module 72 that delivers, firstly, the data field 73 and, secondly, the header 74 of each packet.

The data field 73 is then compressed by the compression module 75 which, for example, implements an adaptive Ziv-Lempel algorithm. In this case, a dictionary is permanently updated in a memory 76.

The compressed data field 77 is then transmitted to a comparison module 78 which selects the shortest data field 79 (comparison between the compressed field 77 and the non-compressed field 73 and selection of the shortest field and, if the lengths are equal, the selection of the non-compressed field, which will require less processing at reception).

Should several compression means be implemented in parallel, the module 78 nevertheless carries out the most efficient selection (namely that of the compression mode offering the best compression rate). If necessary, the selection may be done for each packet.

A module 80 for the construction of the sub-headers 81 prepares each sub-header (for example according to the format of FIG. 4) by taking account of the header 74 (to extract the bits Q and M) and information elements relating to length L and activation of the compression C delivered by the module 78.

These sub-headers 81 and compressed data fields 79 are then concatenated and sliced to the size of the segments (or packets) (82) so as to create full segments (and more generally full packets).

In practice, this operation of concatenation and slicing is done continuously. The pieces of data are compressed and concatenated. As soon as the concatenation reaches the length of a packet, this full packet 83 is delivered to a transmission module 84 which takes responsibility for transmitting it to the addressee terminal.

Thus, only full packets are transmitted. This principle, however, may introduce a certain delay in the transmission of a source packet (a period of waiting for the packet to be transmitted to be full). A delay management mechanism is therefore advantageously set up.

Such a mechanism is also necessary at the end of a source sequence (end of message). Indeed, it is unlikely that the last packet will be full but it should of course be transmitted all the same. Two time delays D1 and D2 are therefore taken into account as follows:

D1: full segment time delay: a non-full packet is sent but this packet has only full segments (this time delay is notably useful in the case of the TRANSPAC network where the invoicing is done by segments);

D2: maximum time delay: transmission of a packet containing a last non-full segment (this time delay is necessary to prevent the device from being inhibited, notably at the end of a source sequence).

Preferably, D2 will be chosen so as to be far smaller than D1, so as to minimize the number of segments sent.

Figure 6:
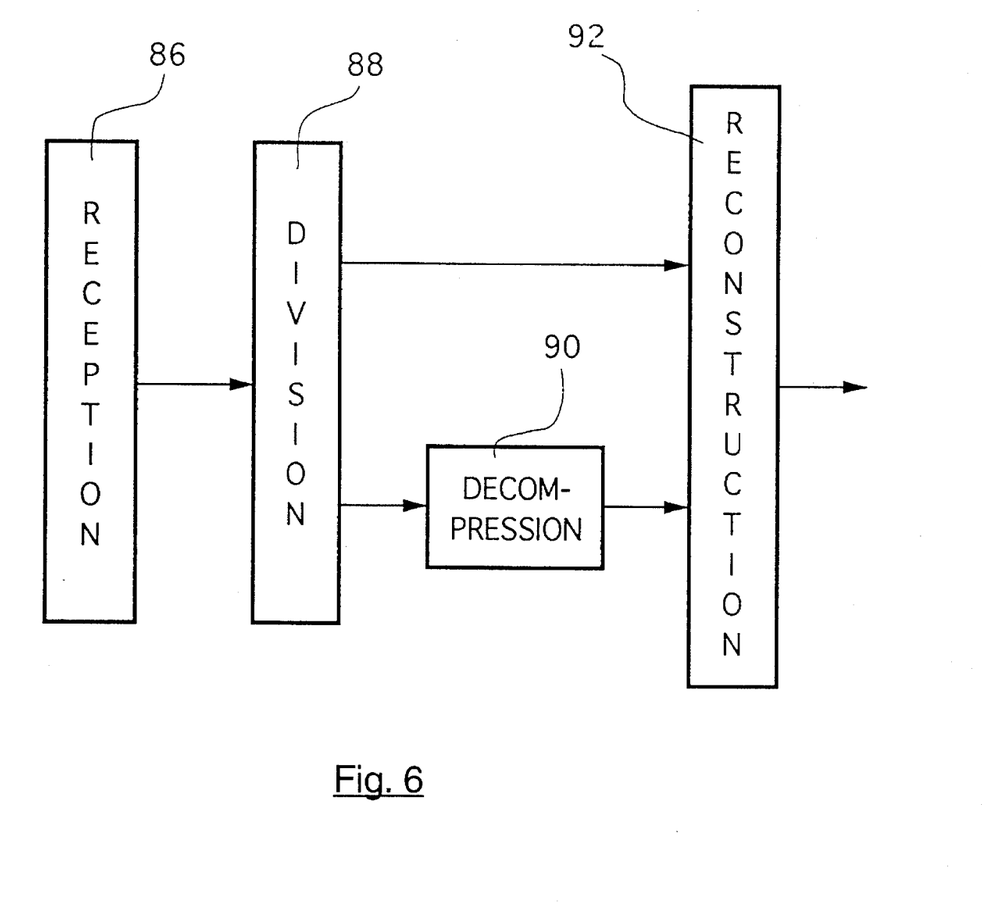
FIG. 6 is a simplified drawing of a device implementing the decompression and reconstruction method and is symmetric to FIG. 5.

FIG. 6 shows a block diagram of a device in the address terminal implementing the symmetrical decompression method for decompressing the transmitted packets. The decompression device includes a reception module 86 to receive the packets, a division module 88 to divide compression data from the sub-headers, a decompression module 90 to decompress the compressed data, and a reconstruction module 92 to reconstruct the source packets.

The efficiency of the method and of the device of the invention can be clearly seen in FIG. 3, since it is observed that two packets ($51_E$, $51_D$) are transmitted while the source sequence has three full packets ($41_A$, $41_B$, $41_C$).

This efficiency is of course even more patently clear when the source packets are not full. In this case, the principle of the concatenation enables a substantial gain in the number of packets (or of segments, namely of portions of packets) transmitted.

In the embodiment described here above, the method of the invention is implanted in dedicated compression units inserted between a terminal and the network. A dedicated compression unit such as this may be, for example, an apparatus of the COMPLYS range (registered mark) marketed by the firm OST (registered mark).

This method can also be directly integrated into a terminal such as, for example, a terminal incorporating an x25 PCSNET communications card (registered mark) also marketed by OST.

It may also be integrated into a communications network element and, for example, into an ECOM25 (registered mark) by OST.

Furthermore, as mentioned further above, the method of the invention is not limited to the x25 networks. Indeed, it may be implemented on any protocol layer providing a service in connected mode (namely having a reliable logic connection having neither losses nor duplication nor desequencing). For example, it may be implemented in local network terminals such as those using the standard TCP/IP (the compression being then implemented at the layer 4 (TCP) or above). The terminal may notably be a terminal equipped with a MAGELLAN (registered mark) card.

The embodiment that has been presented proposes the introduction of the sub-headers indicating the following length of the data sub-field. It is clear however that the invention can be implemented in many other ways provided that the packets (or PDUs) transmitted convey information enabling the reconstruction of the source packets (or PDUs).

For example, it is not obligatory for a sub-header to be inserted between each data sub-field and the next one. It is enough for them to appear regularly (for example every five sub-fields), each sub-header then bearing information elements that enable the extraction of several (for example five) consecutive data sub-fields.

Furthermore, the information on the length of the data sub-field or sub-fields may be replaced by a designator indicating the absolute position (and no longer the relative position) of the end of the sub-field in the transmitted packet.

According to another mode of implementation, it is also possible, between each data sub-field and the next one, to insert a data block having a predetermined format (or marker) known to the receiver terminal. When it detects this marker, the terminal knows that a new source packet is beginning.

It is also possible, at the start of each data field of the packets to be transmitted, to provide for a zone describing the contents of the packet (for example describing the locations of the changes of source packets). A zone such as this (or descriptor) corresponds in other words to an extension of the header of the packets to be transmitted.

What is claimed is:

1. A data compression or decompression method of the type applied to a system of data transmission by exchanging protocol data units between at least one transmitter terminal and at least one receiver terminal, each of said protocol data units comprising a header field and a data field, the compression method comprising the steps of:

associating with a first sequence of N source protocol data units, a second sequence of M protocol data units to be transmitted, M being smaller than or equal to N;

associating with at least certain data fields of said protocol data units to be transmitted, data that correspond to the compression of data contained in the data fields of at least two of said source protocol data units, the compression being according to at least one compression algorithm;

associating with at least certain of said protocol units to be transmitted, reconstruction data that enables the reconstruction of said first sequence of source protocol data units from said second sequence of protocol data units to be transmitted;

concatenating the compressed data and the reconstruction data to form a sequence of concatenated data; and slicing said sequence of concatenated data into data blocks, the data field of each of said protocol data units to be transmitted comprising at least one of said data blocks.

2. Method according to claim 1, further comprising the steps of:

receiving said first sequence of source protocol data units, data compression associating, with said protocol data units, a compressed data sub-field comprising data corresponding to the compression of the data of tile data field of said source protocol data units, generating data for the reconstruction of said source protocol units, concatenating said reconstruction data and said compressed data subfield in said sequence of concatenated data, slicing of said sequence of concatenated data into data blocks having a predetermined length chosen from a sub-set of at least one possible length, creating said second sequence of protocol data units to be transmitted, the data field of each of said protocol data units to be transmitted comprising at least one of said data blocks.

3. Method according to claim 2, wherein said generating step comprises a step of associating with each of said compressed data sub-fields, a sub-header comprising at least one information element representing the length of said compressed data sub-field.

4. Method according to claim 1, wherein said reconstruction data comprises at least one information element present in the header field of each of said source protocol data units.

5. Method according to claim 3, wherein said sub-header comprises at least one first byte bearing at least one information element present in the header field of the source protocol data unit corresponding to said sub-header, and at least one second byte bearing the length of the associated compressed data sub-field.

6. Method according to claim 2, wherein said generating step comprises a step of associating with each of said compressed data sub-fields, a sub-header comprising at least one designator designating the position of the end of said sub-field in the data field of the corresponding protocol unit to be transmitted.

7. Method according to claim 2, wherein said generating step comprises a step to generate a marker having a predetermined content, known to said receiver terminal.

8. Method according to claim 2, wherein the generating step comprises a step of associating a descriptor of the content of the data field of said protocol data unit with each protocol data unit to be transmitted.

9. Method according to claim 1, wherein said compression algorithm is an adaptive compression algorithm managing dictionaries of series of data at transmission and at reception, said dictionaries being updated identically at each transmission of one of said protocol data units.

10. Method according to claim 1, wherein said second associating step comprises the steps of:

implementing a compression algorithm that associates a compressed data field with a source data field;

comparing the length of said source data field and compressed data field, and selecting the shortest data field as a compressed data sub-field.

11. Method according to claim 3, wherein said sub-header comprises an information element representing the source data field or the compressed data field.

12. Method according to claim 1, wherein said protocol data units belong to the group consisting of data packets, frames of data, and transport layer protocol data units.

13. Method according to claim 2, wherein said protocol data units have a protocol data unit length chosen from a set of at least one possible length, and in that the length of said data blocks is a sub-multiple of said chosen length of protocol data units.

14. Method according to claim 1, further comprising a step of verifying that the receiver comprises means for carrying a decompression method corresponding to said compression method, before activating a compression.

15. Method according to claim 1, further comprising the step of providing a first time-delay before the creation of a non-full protocol data unit to be transmitted.

16. Method according to claim 15, further comprising the step of providing a second time-delay before the creation of a protocol data unit to be transmitted comprising at least one full data block of a predetermined length and no data block that is not full, the second time delay being smaller than the first time delay.

17. Method for the decompression of compressed protocol data units according to the method of claim 1, further comprising the steps of:

searching for anti analyzing said data enabling the reconstruction of said first sequence of protocol data units, decompressing said data corresponding, in compressed form, to the data contained in the data fields of the source protocol data units; and restituting said first sequence of source protocol data units.

18. Data compression and/or decompression device, of the type applied to a system of data transmission by exchanging protocol data units between at least one transmitter terminal and at least one receiver terminal, each of said protocol data units comprising a header field and a data field, characterized in that it comprises compression means associating, in at least one direction of data transmission and for at least one communication, with a first sequence of N source protocol data units, a second sequence of M protocol data units to be transmitted, M being smaller than or equal to N, said compression means comprising:

data compression means, according to at least one compression algorithm, providing for the compression of data contained in the data fields of at least two of said source protocol data units;

means for generating reconstruction data that enable the reconstruction of said first sequence of source protocol data units from said second sequence of protocol data units to be transmitted;

means for concatenating the compressed data and the reconstruction data to form a sequence of concatenated data, and for slicing said sequence of concatenated data into data blocks; and means for transmitting protocol data units to be transmitted comprising at least one of said data blocks.

19. Device according to claim 18, further comprising means for decompression of data compressed by said compression means, said decompression means comprising:

means for dividing said reconstruction data and said data blocks comprised in said protocol data units to be transmitted;

decompression means symmetric to said data compression means, providing for decompressed source data; and means for reconstruction of said source protocol data units, from said decompressed source data, under the control of said reconstruction data.

20. Device according to claim 18, further comprising means of connection to at least one transmitter/receiver terminal behaving similarly to the data transmission system, and means of connection to said data transmission system behaving similarly to said transmitter/receiver terminal.

21. Device according to claim 18, wherein said device is integrated with one of said terminals or with an element of a communications network interconnecting said terminals.

* * * * *

UNITED STATES PATENT AND TRADEMARK OFFICE
CERTIFICATE OF CORRECTION

PATENT NO. : 5,521,940
DATED : MAY 28, 1996
INVENTOR(S) : THAO LANE, JEAN-MARC ERNAULT, BERNARD THEPAULT

It is certified that error appears in the above-indentified patent and that said Letters Patent is hereby corrected as shown below:

Col. 1, line 45, after "the", delete "x25", insert --X25--

Col. 5, line 29, after "standard", delete "x25", insert --X25--

Col. 7, line 8, after "protocol", delete "x25", insert --X25--

Col. 7, line 27, after "standard", delete "x25", insert --X25--

Col. 8, line 26, after "protocol", delete "x25", insert --X25--

Col. 8, line 31, delete "x25", insert --X25--

Col. 9, line 62, after "an", delete "x25", insert --X25--

Col. 10, line 2, before "networks", delete "x25", insert --X25--

Col. 12, line 14, after "for", delete "anti", insert --and--

Signed and Sealed this

Seventeenth Day of September, 1996

*Attest:*

BRUCE LEHMAN

*Attesting Officer*      *Commissioner of Patents and Trademarks*